United States Patent
Jang et al.

(10) Patent No.: US 10,732,748 B2
(45) Date of Patent: Aug. 4, 2020

(54) PASSIVE MATRIX ORGANIC LIGHT EMITTING DIODE DISPLAY

(71) Applicant: Solomon Systech (Shenzhen) Limited, Shenzhen (CN)

(72) Inventors: Hong Jae Jang, Seoul (KR); Hyung-Cheol Shin, Daejeon (KR); Il-Hyun Yun, Daejeon (KR); Wah Chi Raymond Wang, Hong Kong (HK); Johnkid Lo, Hong Kong (HK); King Ho Cheung, Hong Kong (HK); Yip Fai Li, Hong Kong (HK)

(73) Assignee: Soloman Systech (Shenzhen) Limited, Shenzhen (CN)

( * ) Notice: Subject to any disclaimer, the term of this patent is extended or adjusted under 35 U.S.C. 154(b) by 30 days.

(21) Appl. No.: 16/143,440

(22) Filed: Sep. 26, 2018

(65) Prior Publication Data

US 2019/0102024 A1 Apr. 4, 2019

(30) Foreign Application Priority Data

Sep. 29, 2017 (KR) .......................... 10-2017-0127444

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
CPC ............... G06F 3/0412; G06F 3/04166; G06F 3/04164; G06F 3/0443; G06F 3/0416;
(Continued)

(56) References Cited

U.S. PATENT DOCUMENTS 10,387,705 B2 * 8/2019 Liu .................... G06K 9/0002
2001/0028217 A1 * 10/2001 Kataoka .............. G02F 1/13439
313/506

(Continued)

FOREIGN PATENT DOCUMENTS

JP 2013167786 A * 8/2013

OTHER PUBLICATIONS

Office Action issued in corresponding Korean patent application No. 1020170127444 dated May 24, 2019.

*Primary Examiner* — Julie Anne Watko
(74) *Attorney, Agent, or Firm* — Idea Intellectual Limited; Margaret A. Burke; Sam T. Yip

(57) ABSTRACT

A PMOLED display includes a plurality of lower electrode patterns arranged in parallel in the x-axis direction, a plurality of transparent electrode patterns arranged in parallel in the y-axis direction and being perpendicular to the lower electrode patterns, and an organic compound layer interposed between the lower electrode patterns and the transparent electrode patterns. A display output and a touch sensing is performed by time-sharing a control period for the lower electrode patterns and the transparent electrode patterns into a display control period and a touch-sensor control period in every display frame time. The PMOLED display includes a driving node formed on a line for communication between the transparent electrode patterns and a display driving circuit, a touch-sensing unit connecting the driving node and a touch-sensing circuit; and a plurality of metal electrode patterns provided between the transparent electrode patterns to have a length shorter than the transparent electrode patterns.

10 Claims, 10 Drawing Sheets

(51) Int. Cl.
  *G09G 3/3216* (2016.01)
  *G06F 3/044* (2006.01)
(52) U.S. Cl.
  CPC ........ *G06F 3/0443* (2019.05); *G06F 3/04164* (2019.05); *G06F 3/04166* (2019.05); *G09G 3/3216* (2013.01); *H01L 27/323* (2013.01); *H01L 27/3281* (2013.01); *G09G 2300/0413* (2013.01); *G09G 2300/0426* (2013.01); *G09G 2354/00* (2013.01)
(58) Field of Classification Search
  CPC ............... G06F 3/044; G09G 3/3216; G09G 2300/0413; G09G 2300/0426; G09G 2354/00; H01L 27/323; H01L 27/3281
  See application file for complete search history.

(56) References Cited

U.S. PATENT DOCUMENTS

| | | | | |
|---|---|---|---|---|
| 2010/0110038 A1* | 5/2010 | Mo | ............... | G06F 3/044 345/174 |
| 2010/0214247 A1* | 8/2010 | Tang | ............... | H03K 17/98 345/173 |
| 2010/0328255 A1* | 12/2010 | Ishizaki | ............... | G06F 3/044 345/174 |
| 2011/0279400 A1* | 11/2011 | Yilmaz | ............... | G06F 3/0416 345/174 |
| 2012/0056664 A1* | 3/2012 | Nam | ............... | G06F 3/044 327/517 |
| 2012/0075232 A1* | 3/2012 | Golovchenko | ............... | G06F 3/044 345/174 |
| 2013/0265244 A1* | 10/2013 | Kim | ............... | G06F 3/044 345/173 |
| 2014/0132534 A1* | 5/2014 | Kim | ............... | G06F 3/0412 345/173 |
| 2014/0152613 A1* | 6/2014 | Ishizaki | ............... | G06F 3/0412 345/174 |
| 2014/0160374 A1* | 6/2014 | Wang | ............... | G06F 3/044 349/12 |
| 2014/0184560 A1* | 7/2014 | Adachi | ............... | G06F 3/0412 345/174 |
| 2014/0253828 A1* | 9/2014 | Liu | ............... | G06F 3/047 349/12 |
| 2014/0285465 A1* | 9/2014 | Hayashi | ............... | G06F 3/044 345/174 |
| 2014/0320760 A1* | 10/2014 | Ishizaki | ............... | G06F 3/044 349/12 |
| 2015/0022470 A1* | 1/2015 | Lee | ............... | G06F 3/0412 345/173 |
| 2015/0048346 A1* | 2/2015 | Lee | ............... | H01L 27/323 257/40 |
| 2015/0069373 A1* | 3/2015 | Lee | ............... | H01L 27/323 257/40 |
| 2015/0109248 A1* | 4/2015 | Tokai | ............... | G06F 3/044 345/174 |
| 2015/0130753 A1* | 5/2015 | Woo | ............... | G06F 3/044 345/174 |
| 2015/0170610 A1* | 6/2015 | Kurasawa | ............... | G09G 5/18 345/174 |
| 2015/0179122 A1* | 6/2015 | Brown | ............... | G06F 3/0416 345/174 |
| 2016/0062505 A1* | 3/2016 | Hwang | ............... | G06F 3/0412 345/174 |
| 2016/0188029 A1* | 6/2016 | Liu | ............... | G02F 1/13338 345/174 |
| 2016/0291725 A1* | 10/2016 | Zhai | ............... | G06F 3/0412 |
| 2016/0291759 A1* | 10/2016 | Kurasawa | ............... | G06F 3/0412 |
| 2016/0349907 A1* | 12/2016 | Kobayashi | ............... | G06F 3/0412 |
| 2017/0185202 A1* | 6/2017 | Qu | ............... | G02F 1/13338 |
| 2017/0220182 A1* | 8/2017 | Schwartz | ............... | G06F 3/0416 |
| 2017/0255306 A1* | 9/2017 | Xie | ............... | G02F 1/133345 |
| 2018/0017821 A1* | 1/2018 | Miyazaki | ............... | G02F 1/1333 |
| 2018/0039367 A1* | 2/2018 | Suzuki | ............... | G06F 3/0412 |
| 2018/0120973 A1* | 5/2018 | Nakamura | ............... | G06F 3/044 |
| 2018/0164931 A1* | 6/2018 | Na | ............... | G06F 3/0412 |

\* cited by examiner

PASSIVE MATRIX ORGANIC LIGHT EMITTING DIODE DISPLAY

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS-REFERENCE TO RELATED APPLICATION

The present invention claims priority to Korean Patent Application No. 10-2017-0127444 filed Sep. 29, 2017, the disclosure of which is incorporated by reference herein.

FIELD OF THE INVENTION

The present invention relates to a display using a passive matrix organic light emitting diode (PMOLED) among organic light emitting diodes and more particularly, to a PMOLED display capable of implementing a touch by an in-cell structure in the PMOLED.

BACKGROUND

Since an organic light emitting diode directly emits light from an emission layer positioned between a cathode and an anode, there is an advantage in that a backlight is not required, an expression range of light is wider than that of a Liquid Crystal Display (LCD), and a black level is excellent. That is, in the organic light emitting diode, when a voltage is applied to the cathode and the anode, electrons and holes are injected into each electrode and the injected electrons and holes pass through an electron transport layer and a hole transport layer, respectively, to be coupled to each other in the emission layer.

A light emitting material of the emission layer is excited by energy due to the coupling and the light is generated when the light emitting material returns from the excited state to a ground state again. The light generated when the light emitting material returns from the excited state (singlet state) to the ground state as it is fluorescence, and the light used when the light emitting material returns from the singlet state to the ground state via a triplet state having a slight low energy level is phosphorescence. In spite of the excited state, energy that is not properly used with the light may be inactivated without being emitted.

In the organic light emitting diode, as the cathode, a metal thin film such as aluminum and silver/magnesium alloys, calcium, and the like, and as the anode, a transparent metal thin film such as indium tin oxide called ITO may be used. An organic compound layer formed between the cathode and the anode may include a hole injection layer (HIL), a hole transport layer (HTL), an emission layer (EML), an electron transport layer (ETL), and an electron injection layer (EIL). When a driving voltage is applied between the cathode and the anode, the holes passing through the HTL and the electrons passing through the ETL are moved to the EML to form excitons, and as a result, the EML generates visible light. The generated light is reflected on a reflective surface and transmits a transparent electrode and a substrate (a glass plate, a plastic plate, or the like).

The organic light emitting diode may be classified into a passive matrix organic light emitting diode (PMOLED) and an active matrix organic light emitting diode (AMOLED) according to a control mode thereof.

The PMOLED has a structure in which a voltage is applied to each of a horizontal axis and a vertical axis of a light emitting element which is disposed on a screen, respectively, to illuminate a cross point thereof, and thus, the structure is relatively simple and production cost is low, but there is a disadvantage in that a delicate screen cannot be implemented. The AMOLED is intended to overcome the disadvantage of the PMOLED and has an advantage that a thin film transistor (TFT) is embedded for each light emitting element to control whether each element emits the light, respectively, and recently, since a screen size thereof may be applied to a large device, an application range thereof is widened.

In Korean Patent Registration No. 10-1170806, a device for a passive matrix is described, but particularly, a method for implementing a touch function in the PMOLED is not described.

SUMMARY OF THE INVENTION

An object of the present invention is to provide a PMOLED display capable of implementing a touch function by an in-cell type in a PMOLED and two-dimensionally disposing a touch area.

Another object of the present invention is to provide a PMOLED display capable of removing an effect of a residual capacitance in implementing a touch function in a PMOLED.

Yet another object of the present invention is to provide a PMOLED display having an improved structure in order to implement a touch function in a PMOLED.

According to an exemplary embodiment of the present invention to achieve the objects of the present invention, there is provided a PMOLED display which includes a plurality of lower electrode patterns arranged in parallel in the direction of the x-axis, a plurality of transparent electrode patterns arranged in parallel in the direction of the y-axis and being perpendicular to the lower electrode patterns, and an organic compound layer interposed between the lower electrode patterns and the transparent electrode patterns, to perform a display output and a touch sensing by time-sharing a control period for the lower electrode patterns and the transparent electrode patterns into a display control period and a touch-sensor control period in every display frame time, the PMOLED display comprising: a driving node which is formed on a line for communication between the transparent electrode patterns and a display driving circuit; a touch sensing unit connecting the driving node and a touch sensing circuit; and a plurality of metal electrode patterns provided between the transparent electrode patterns to have a length shorter than the transparent electrode patterns.

According to an exemplary embodiment of the present invention to achieve the objects of the present invention, there is provided a PMOLED display which includes a plurality of lower electrode patterns arranged in parallel in the direction of the x-axis, a plurality of transparent electrode patterns arranged in parallel in the direction of the y-axis and being perpendicular to the lower electrode patterns, and an organic compound layer interposed between the lower electrode patterns and the transparent electrode patterns, to perform a display output and a touch sensing by time-sharing a control period for the lower electrode patterns and the transparent electrode patterns into a display control period and a touch-sensor control period in every display frame time, the PMOLED display comprising: a driving node which is formed on a line for communication between the transparent electrode patterns and a display driving circuit; a touch sensing unit connecting the driving node and a touch sensing circuit; and a plurality of metal electrode patterns provided between the transparent electrode patterns to have a length shorter than the transparent electrode patterns.

In this specification, the x-axis and the y-axis are arbitrarily set directions and used for facilitating the specification of directions and descriptions, and do not denote fixed directions and can be changed to other expressions.

According to the exemplary embodiment, the display output may be performed by connecting the transparent electrode patterns and the display driving circuit in the display control period and the touch sensing may be performed by connecting the transparent electrode patterns and the touch sensing circuit by the touch sensing unit in the touch-sensor control period.

In order to implement the display output and the touch sensing in one display, the display frame time may be time-shared into the display control period and the touch-sensor control period, and in each control period, the display output and the touch sensing may be alternately performed.

Particularly, during the touch sensing, the transparent electrode patterns may sense a location in the x direction with respect to a finger contact and the metal electrode patterns may sense a location in the y direction with respect to the finger contact. Herein, the metal electrode patterns have a length shorter than the transparent electrode patterns to divide an area which may be sensed by the metal electrode patterns and an area which may not be sensed by the metal electrode pattern, and as a result, the touch-sensor control period may be divided into at least two periods in the y direction.

Generally, in the case of the display using the PMOLED, a high resolution is not required and, in many cases, a small screen is constituted. Accordingly, the touch sensing may also be required only when being recognized as a simple operation, not the high resolution. For example, whether a simple touch is present, a division of left and right in the x direction, or only an operation of scrolling up or down at left and right sides may be sensed using the transparent electrode patterns, and a vertical division in the y direction using the metal electrode patterns may be further added as a parameter using the metal electrode patterns.

The metal electrode patterns may be formed on the same layer as and/or adjacent to the transparent electrode patterns, and after a metal thin film is formed, the metal electrode patterns having a width of several μm or less is formed by a photoresist process and the like so that the metal electrode patterns are not visible from the outside.

For example, a plurality of adjacent driving nodes may be interconnected with the touch sensing unit and during the touch sensing, the transparent electrode patterns commonly connected to one touch sensing unit as a group may be used as a single touch sensor.

Herein, display lines connecting the grouped transparent electrode patterns and the display driving circuit may be distributed vertically based on the transparent electrode patterns in order of the groups. Herein, according to the order of the groups, simply, the display lines may be alternately distributed vertically based on the y direction, and differently, the display lines form pairs of two groups and may also be alternately disposed, and may also meet with each other at the center while being alternately disposed at both left and right ends based on the x direction.

The metal electrode patterns corresponding to the grouped transparent electrode patterns may be commonly connected to the touch sensing circuit as a group, and touch lines connecting the grouped metal electrode patterns and the touch sensing circuit are disposed at an opposite side to the display lines of the corresponding grouped transparent electrode patterns at the opposite side, and the display lines may be connected to one side and the touch lines may be connected to the other side.

Even if the grouped metal electrode patterns are not visualized, the grouped metal electrode patterns may affect the overall brightness and a difference in brightness or definition between the area formed with the grouped metal electrode patterns and the area without the grouped metal electrode patterns may be formed. To overcome the problem, metal dummy patterns which are not electrically connected with the outside may be further formed. The metal dummy patterns may be located on the same line as the metal electrode patterns in the y direction, respectively, and may be formed in the area without the metal electrode patterns.

In addition, the metal electrode patterns may be less than $1/3$ of the transparent electrode patterns in length. As a result, depending on the signal levels from the group of the metal electrodes, one can distinguish where the finger touch is located on x direction : on left side metal electrodes, on right side metal electrodes, or in between of the left and right metal electrodes.

In addition, the metal electrode patterns may be formed in various shapes. For example, the metal electrode patterns may be formed to have lengths stepping up, stepping down or stepping up then down in the same group in the x direction and may be entirely formed in a right-angled triangular or isosceles triangular shape.

In the case of the PMOLED, due to a residual capacitance between the transparent electrode patterns and the lower electrode patterns, the touch sensing may not be smooth. As a result, in the exemplary embodiment, in the touch sensing, a pulse type driving voltage may be supplied to the transparent electrode patterns and the lower electrode patterns or the transparent electrode patterns and the lower electrode patterns may be floated. In addition, a signal is synchronized between the transparent electrode patterns and the lower electrode patterns regardless of the presence or absence of the residual capacitance to easily sense a change in constant voltage or capacitance due to an external touch.

In the exemplary embodiment, a touch reference voltage may be uniformly supplied to all the lower electrode patterns before the touch-sensor control period and a display reference voltage may be uniformly supplied to all the lower electrode patterns before the display control period. This is because a voltage set value for the touch sensing and a voltage set value for the display output may be different from each other. In the touch-sensor control period, the pulse type driving voltage may be applied in addition to the touch reference voltage.

The display reference voltage may be set to be higher than the touch reference voltage, and the touch reference voltage may be set in a range of about −3 V or more and about 3 V or less and the display reference voltage may be set in a range of about 5 V or more and about 20 V or less.

According to another exemplary embodiment of the present invention to achieve the objects of the present invention, there is disclosed a PMOLED display, which includes a plurality of lower electrode patterns arranged in parallel in the direction of x-axis, a plurality of transparent electrode patterns arranged in parallel in the direction of y-axis and being perpendicular to the lower electrode patterns, and an organic compound layer interposed between the lower electrode patterns and the transparent electrode patterns, to perform a display output and a touch sensing by time-sharing a control period for the lower electrode patterns and the transparent electrode patterns into a display control period and a touch-sensor control period in every display frame time, the PMOLED display comprising: a driving node which is formed on a line for communication between the transparent electrode patterns and a display driving circuit; a touch sensing unit connecting the driving node and a touch sensing circuit; and a plurality of metal electrode patterns provided to be adjacent to the transparent electrode patterns, in which the display output is performed by connecting the transparent electrode patterns and the display driving circuit in the display control period and the touch sensing is performed by connecting the transparent electrode patterns and the touch sensing circuit by the touch sensing unit in the touch-sensor control period, and the transparent electrode patterns sense a location in the x direction with respect to a finger contact and the metal electrode patterns sense a location in the y direction with respect to the finger contact.

Herein, the metal electrode patterns may be provided to be adjacent to the transparent electrode patterns, in which the metal electrode patterns may be provided between the transparent electrode patterns and the metal electrode patterns may be provided at all or one side of both ends of the transparent electrode patterns in the y direction, and one metal electrode pattern may be formed to correspond to the plurality of transparent electrode patterns.

According to the PMOLED display and the method of controlling the same of the present invention, it is possible to implement a touch function by an in-cell type in the PMOLED and simply two-dimensionally divide and receive a touch area in implementing the touch function in the PMOLED.

Further, it is possible to effectively remove an effect of the residual capacitance by using uniform reset or the like of the driving voltage or the touch reference voltage in implementing the touch function in the PMOLED.

Further, since it is difficult to implement the touch function in the PMOLED, it is not easy to implement the touch function in an execution condition for the display output of the PMOLED. However, in the PMOLED display and the method of controlling the same of the present invention, a condition for the touch sensing may be satisfied while the condition for the display output of the PMOLED is satisfied.

DETAILED DESCRIPTION

Figure 1:
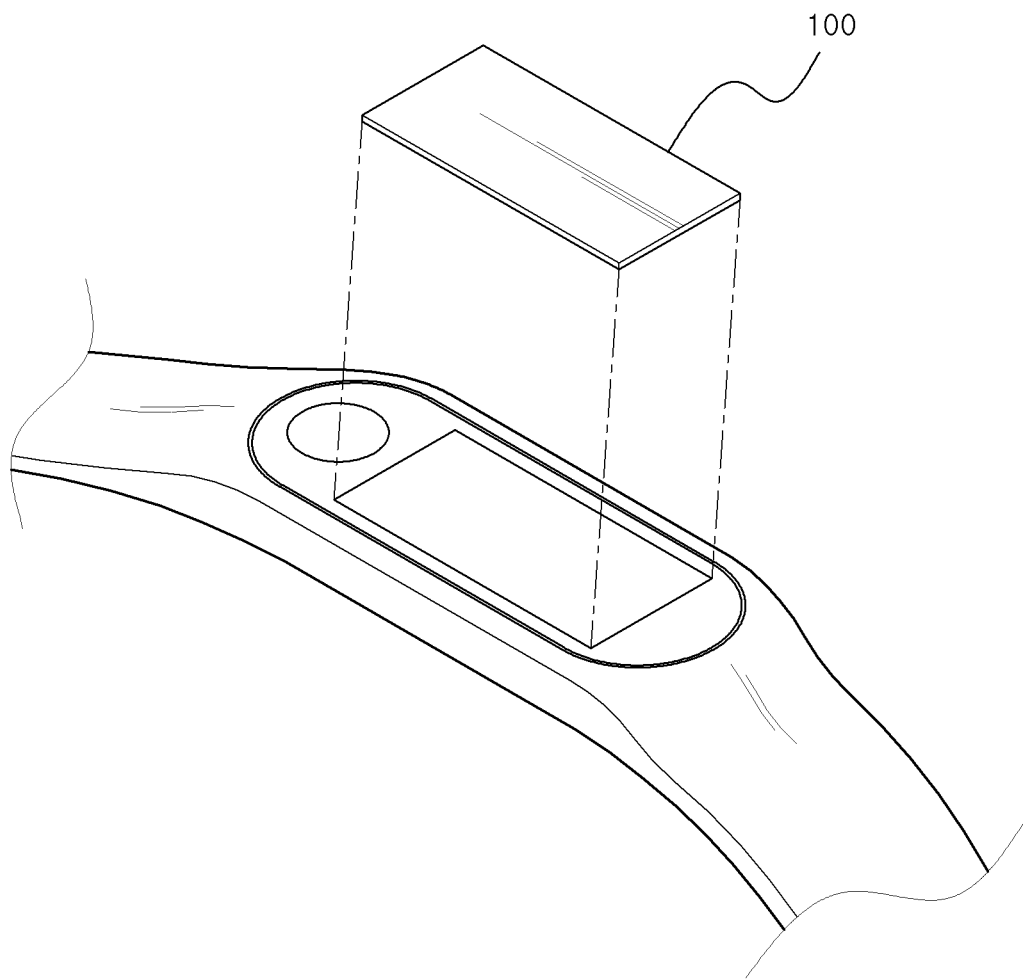
FIG. 1 is a perspective view for describing a use example of a PMOLED display according to an exemplary embodiment of the present invention.

Hereinafter, preferred exemplary embodiments of the present invention will be described in detail with reference to the accompanying drawings, but the present invention is not restricted or limited by the exemplary embodiments. For reference, in this specification, like reference numerals designate substantially like elements. Under such a rule, contents described in other drawings may be cited and described and contents that are determined obviously to those skilled in the art or repeated may be omitted.

Figure 2:
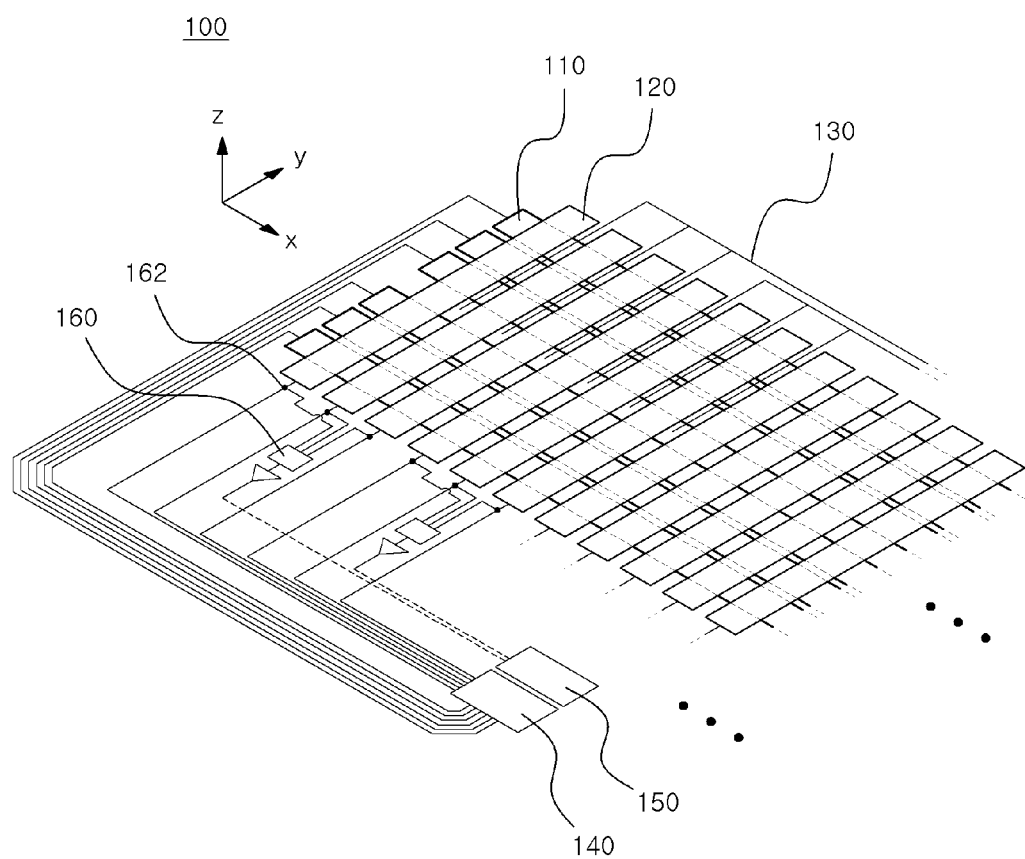
FIG. 2 is a perspective view for describing an electrode pattern structure of the PMOLED display according to the exemplary embodiment of the present invention.
Figure 3:
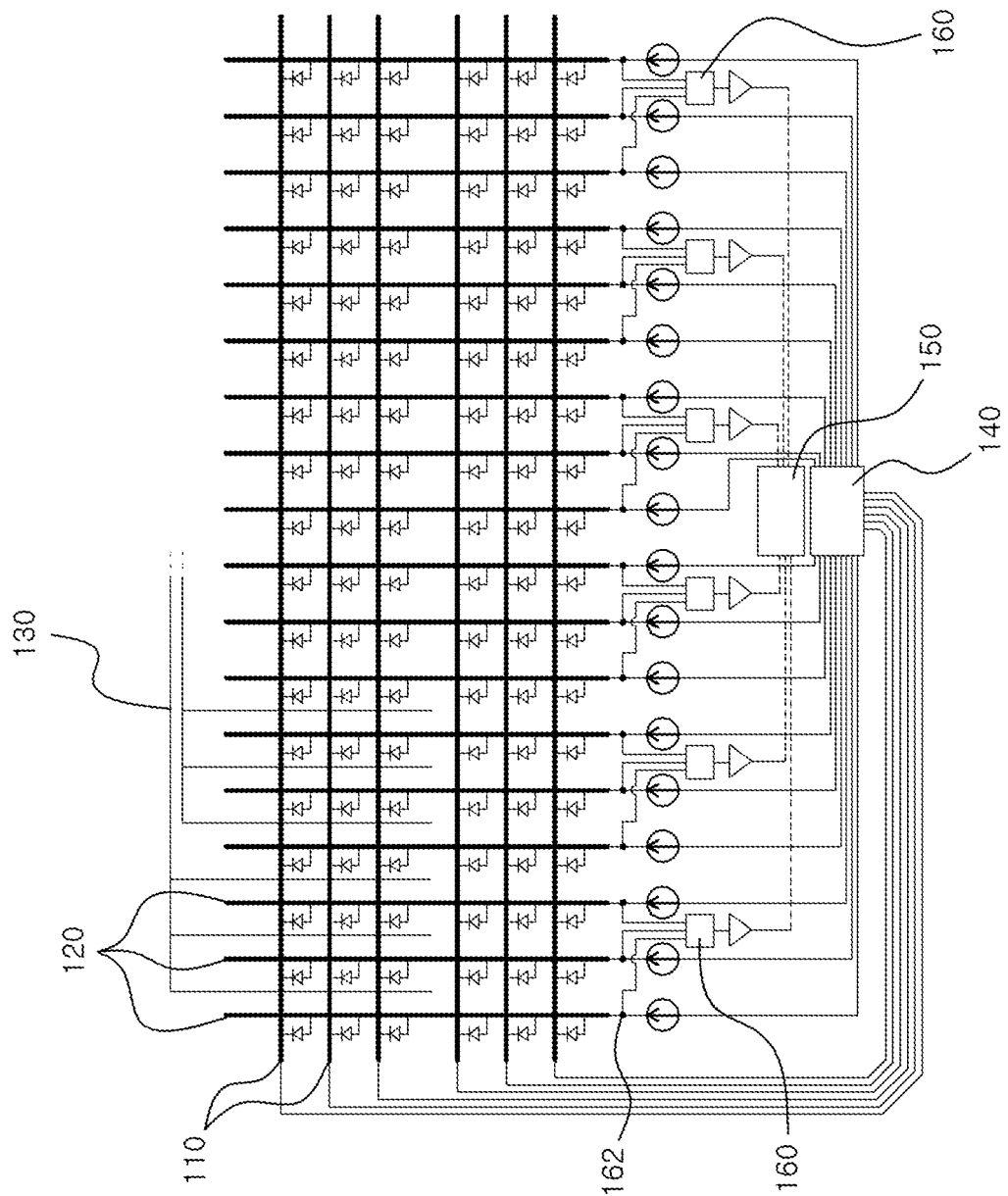
FIG. 3 is a structural view for describing a circuit structure of the PMOLED display of FIG. 2.

FIG. 1 is a perspective view for describing a use example of a PMOLED display according to an exemplary embodiment of the present invention, FIG. 2 is a perspective view for describing an electrode pattern structure of the PMOLED display according to the exemplary embodiment of the present invention, and FIG. 3 is a structural view for describing a circuit structure of the PMOLED display of FIG. 2.

Referring to FIGS. 1 to 3, a PMOLED display 100 according to an exemplary embodiment of the present invention includes a plurality of lower electrode patterns 110 arranged in parallel, a plurality of transparent electrode patterns 120 arranged in parallel and being perpendicular to the lower electrode patterns 110, a plurality of metal electrode patterns 130 provided between the transparent electrode patterns 120 and having a length shorter than the transparent electrode patterns 120, and an organic compound layer interposed between the lower electrode patterns 110 and the transparent electrode patterns 120. The transparent electrode patterns 120 and the lower electrode patterns 110 are connected to a display driving circuit 140, and a desired image or character may be displayed on the PMOLED display 100 for each pixel by the control of the display driving circuit 140.

Figure 5:
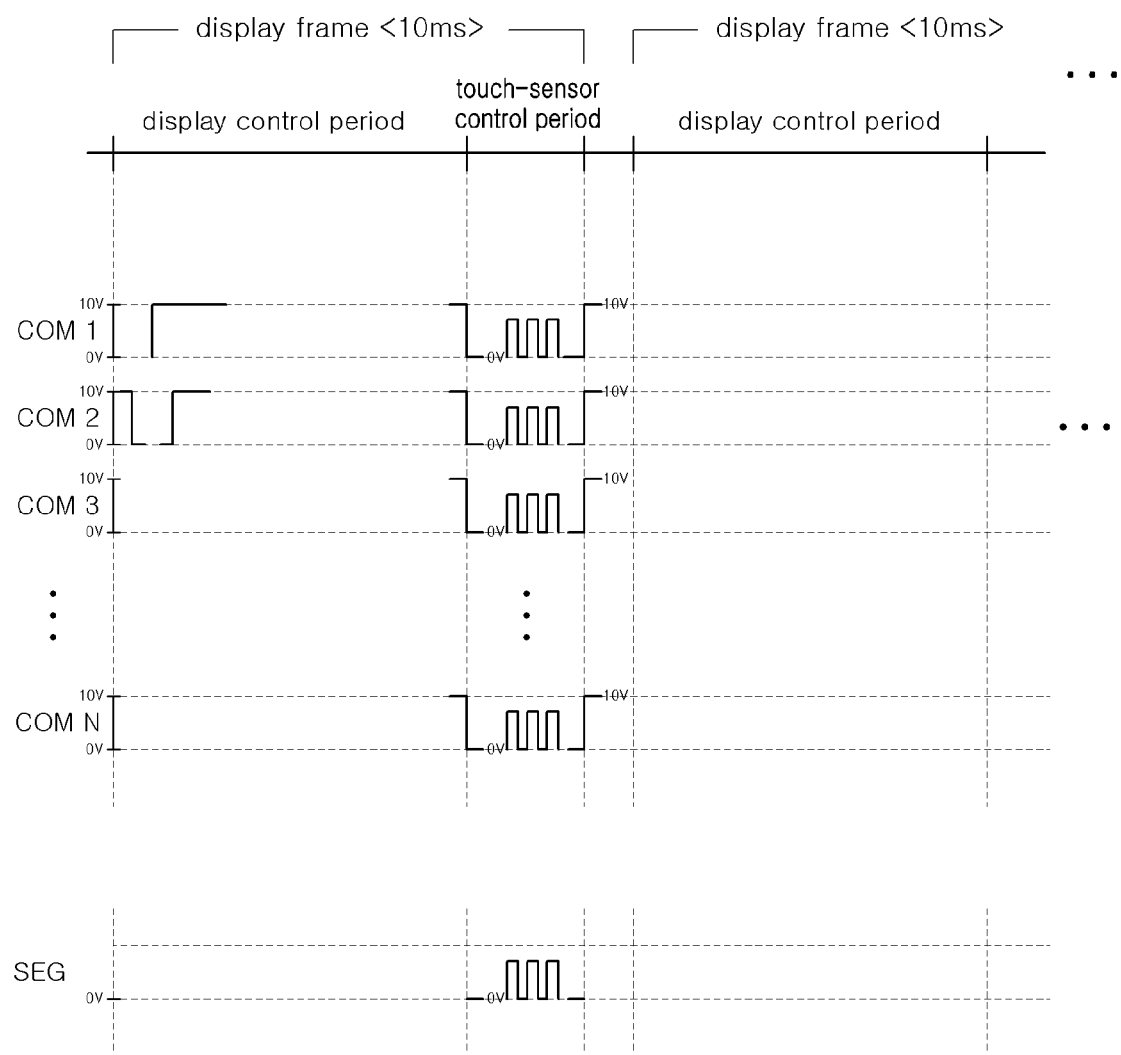
FIG. 5 is a diagram for describing a process of controlling lower electrode patterns in a time-sharing state in every display frame time in the PMOLED display according to the exemplary embodiment of the present invention.

As illustrated in FIG. 5 to be described, the PMOLED display 100 according to the exemplary embodiment time-shares a control period of the transparent electrode patterns 120 and the lower electrode patterns 110 into a display control period and a touch-sensor control period in every display frame time to perform a display output and a touch sensing at different times and alternately perform the display output and the touch sensing.

According to the exemplary embodiment, the PMOLED display 100 further includes a touch sensing circuit 150 in addition to the display driving circuit 140. The display driving circuit 140 and the touch sensing circuit 150 are functionally separated from each other, but may be formed together in one integrated circuit (IC) and like the exemplary embodiment, may also be functionally separated from each other.

However, a separate touch sensor is not used for the touch sensing and in the PMOLED display 100 according to the exemplary embodiment, the transparent electrode patterns 120 disposed relatively above and the metal electrode patterns 130 disposed therebetween may be used as the touch sensor. To this end, a driving node 162 is formed on a line for communication between the transparent electrode patterns 120 and the display driving circuit 140, and the touch sensing circuit 150 and the transparent electrode patterns 120 may be electrically connected to each other through the driving node 162. Herein, a touch sensing unit 160 may be provided between the driving node 162 and the touch sensing circuit 150. The touch sensing unit 160 may perform a kind of switch function capable of selectively connecting the transparent electrode patterns 120 and the touch sensing circuit 150 and implement the touch sensing by electrically connecting the transparent electrode patterns 120 and the touch sensing circuit 150 only in the aforementioned touch-sensor control period. The touch sensing unit 160 may also be provided as a separate component, but may also be included together the IC formed with the touch sensing circuit 150.

Further, the metal electrode pattern 130 is formed to have a length of about ½ of the transparent electrode pattern 120 and the metal electrode pattern 130 may divide an area corresponding to the upper portion in the y direction. Accordingly, while a location in the x direction is measured by the transparent electrode patterns 120, an area sensed by the metal electrode patterns 130 may be disposed above in the y direction and an area which is not sensed by the metal electrode patterns 130 may be disposed below in the y direction.

Functionally, in the display control period, the display driving circuit 140 controls the transparent electrode patterns 120 and the lower electrode patterns 110 for the display output, and in the touch-sensor control period, the touch sensing circuit 150 may control the transparent electrode patterns 120, the metal electrode patterns 130, and the lower electrode patterns 110 for the touch sensing.

According to the exemplary embodiment, in the PMOLED display 100, since the transparent electrode patterns 120 and the lower electrode patterns 110 are formed over a relatively large area, the transparent electrode patterns 120 and the lower electrode patterns 110 may be largely influenced by the residual capacitance therebetween, and such a residual capacitance adversely affects a Signal-to-Noise Ratio (SNR) in the touch sensing, thereby making it impossible to sense a change in constant voltage or a change in capacitance by a finger contact.

Figure 4:
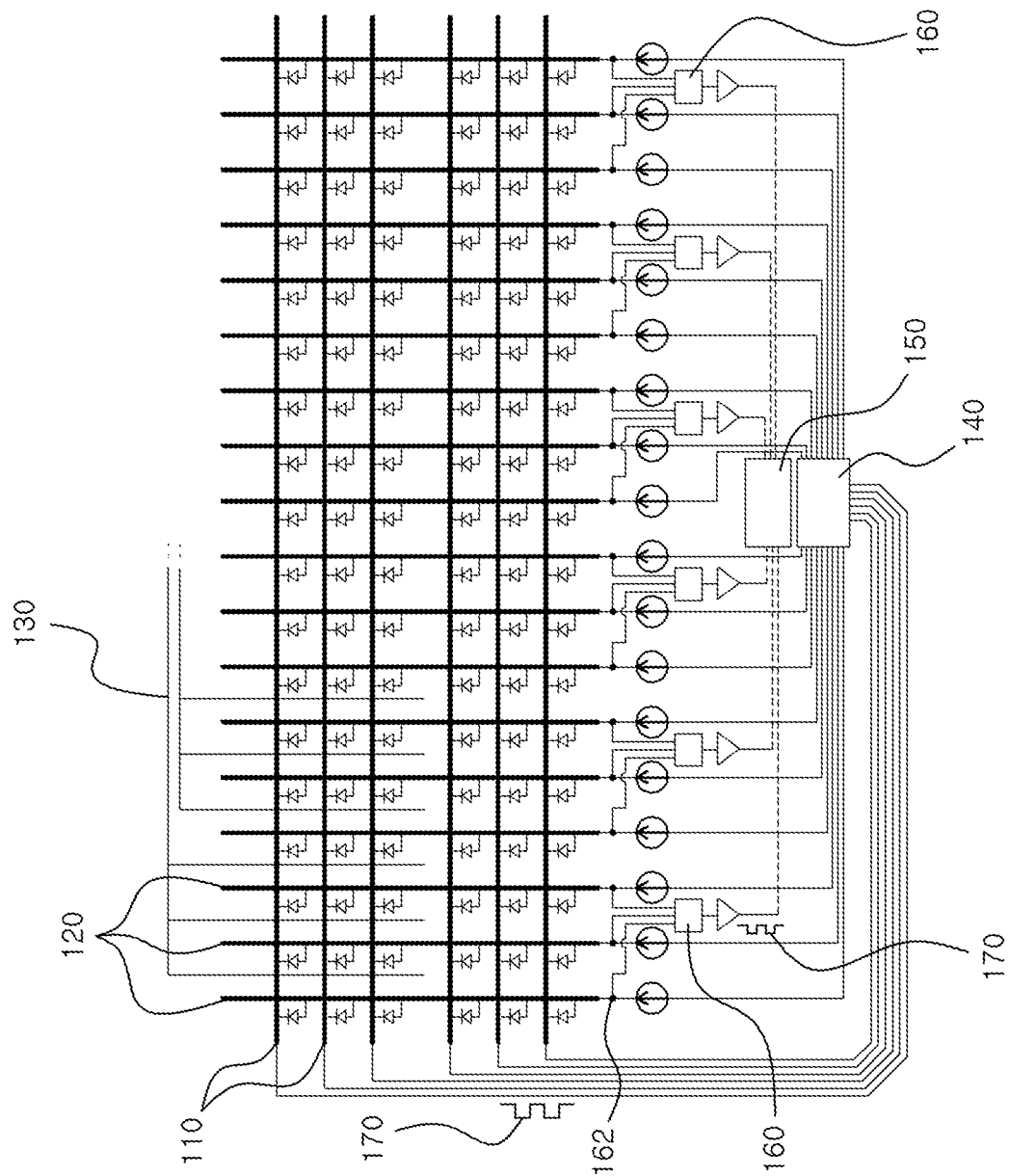
FIG. 4 is a diagram for describing a process of supplying a driving voltage for touch sensing in the PMOLED display according to the exemplary embodiment of the present invention.

FIG. 4 is a diagram for describing a process of supplying a driving voltage for touch sensing in the PMOLED display according to the exemplary embodiment of the present invention and FIG. 5 is a diagram for describing a process of controlling lower electrode patterns in a time-sharing state in every display frame time in the PMOLED display according to the exemplary embodiment of the present invention.

Referring to FIG. 4, in the touch sensing, a pulse type driving voltage 170 may be supplied to the transparent electrode patterns 120 and the lower electrode patterns 110. The voltage is synchronized and changed in the transparent electrode patterns 120 and the lower electrode patterns 110 by the driving voltage 170, and a change in constant voltage or capacitance due to an external touch may be easily sensed between the transparent electrode patterns 120 and the lower electrode patterns 110 regardless of the presence or absence of the residual capacitance. Of course, in some cases, the pulse type driving voltage may also be supplied even to the metal electrode patterns 130. In addition, it is also possible to float the transparent electrode patterns, the lower electrode patterns, or the metal electrode patterns.

Referring to FIG. 5, in the display control period, a voltage of about 10 V may be generated in the lower electrode patterns 110, and in this case, even though the pulse type driving voltage is supplied to the transparent electrode patterns 120 and the lower electrode patterns 110, the touch sensing may not be smooth.

To solve the problem, in the exemplary embodiment, a touch reference voltage of about −3 V or more and 3 V or less may be uniformly supplied to all the lower electrode patterns 110. The lower electrode patterns 110 are maintained at a relatively low voltage and thus, the touch sensing using the transparent electrode patterns 120 may be smooth.

As illustrated in the drawings, in the touch-sensor control period, the pulse type driving voltage may be applied in addition to the touch reference voltage, and a pulse having the same waveform may be supplied to the transparent electrode patterns (SEG) 120 and the lower electrode patterns (COM) 110.

However, when the touch-sensor control period ends, before the display control period, a display reference voltage of about 5 V or more and 20 V or less may be uniformly supplied to all the lower electrode patterns 110. As an example, the display reference voltage of about 10 V is supplied to all the lower electrode patterns 110 to reset pixels for the display, thereby entirely maintaining an initial state in which the organic light emitting diode is not emitted.

As described above, it is preferred that the display reference voltage is set to be higher than the touch reference voltage, and particularly, the touch reference voltage may be set to have a predetermined value in the range of about −3 V or more and about 3 V or less and the display reference voltage may be set to have a predetermined value in the range of about 5 V or more and about 20 V or less.

Referring back to FIGS. 2 and 3, three transparent electrode patterns 120 may be grouped by one touch sensing unit 160. In the case of the display output, each transparent electrode pattern 120 may function as each independent segment electrode (SEG) or anode. However, in the case of the touch sensing, the transparent electrode patterns 120 are partially grouped without using each independent touch sensor to sense a body contact.

Generally, in the case of the display using the PMOLED, a high resolution is not required and, in many cases, a small screen is constituted. Accordingly, the touch sensing may also be required only when being recognized as a simple operation, not the high resolution. For example, it may be sufficient to sense whether a simple touch is present, a division of left and right, and only an operation of scrolling up or down.

To this end, even if the number is not three, two or more transparent electrode patterns 120 form groups, and in the touch-sensor control period, the transparent electrode patterns 120 forming the groups are connected into one by the touch sensing unit 160 to function just like a single touch sensor.

To this end, a plurality of driving nodes 162 adjacent to each other may be interconnected with one touch sensing unit 160, and the plurality of transparent electrode patterns 120 may be commonly connected with the touch sensing circuit as a group by the touch sensing unit 160 using a switching circuit or the like. As a result, there is an advantage in that the number of lines for the touch sensing may be reduced and circuit formation and the like may be facilitated.

FIGS. 6 to 9 are diagrams for describing various examples of implementing metal electrode patterns between transparent electrode patterns in a PMOLED display according to another exemplary embodiment of the present invention.

Figure 6:
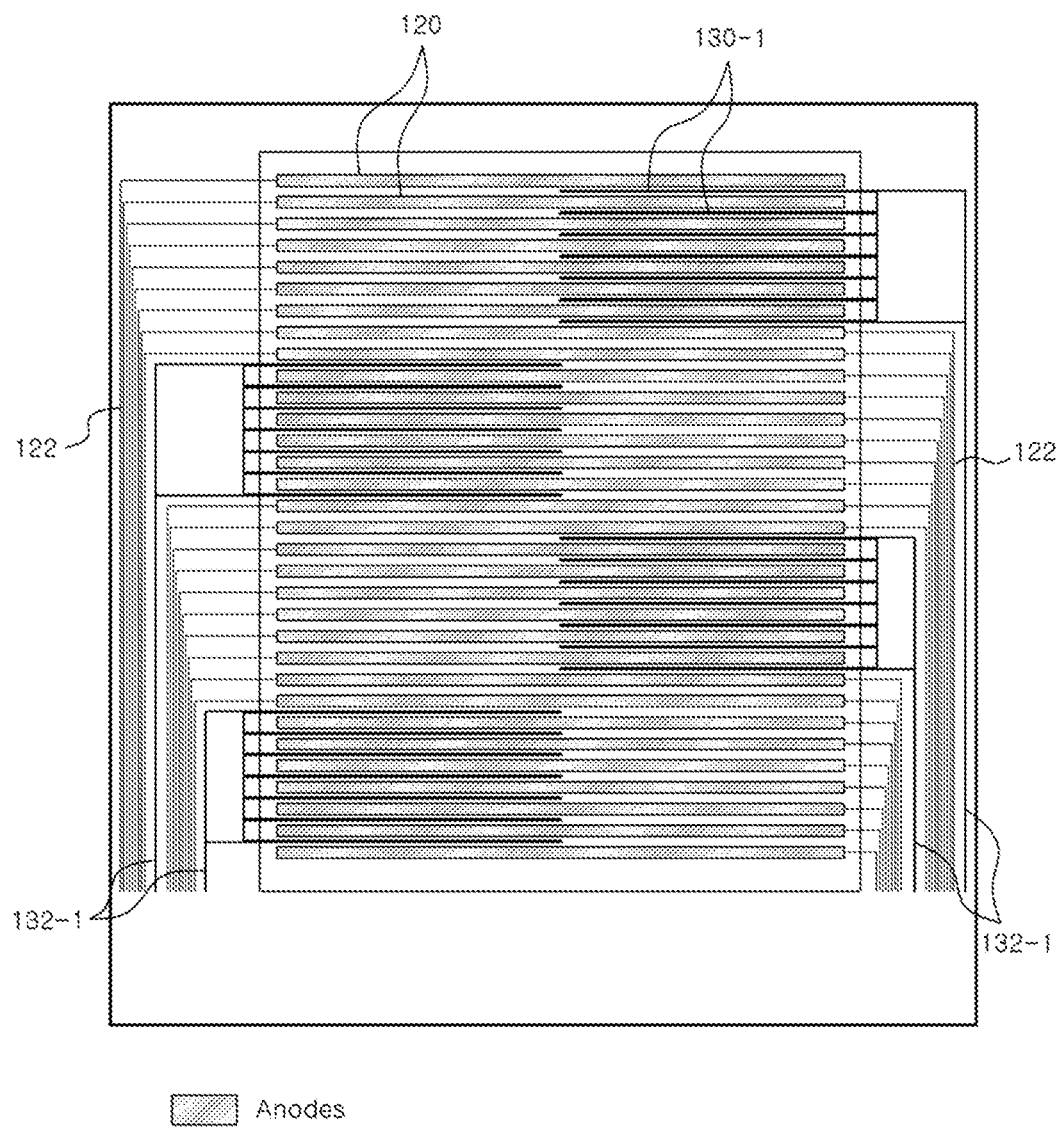
FIGS. 6, 7, 8 and 9 are diagrams for describing various examples of implementing metal electrode patterns between transparent electrode patterns in a PMOLED display according to another exemplary embodiment of the present invention.

Referring to FIG. 6, metal electrode patterns 130-1 may be formed on the same layer as and/or adjacent to the transparent electrode patterns 120, and after a metal thin film is formed, the metal electrode patterns 130-1 having a width of several μm or less may be formed by a photoresist process and the like so that the metal electrode patterns 130-1 are not visible from the outside.

Display lines 122 connecting the grouped transparent electrode patterns 120 and the display driving circuit may be distributed vertically in the y direction based on the transparent electrode patterns 120 in order of the groups. Herein, according to the order of the groups, as illustrated in FIG. 6, the display lines may be alternately distributed vertically. For reference, the touch sensing unit, the driving node, or the like is actually present, but may not be illustrated and may also be formed in the integrated circuit.

In addition, the transparent electrode patterns and the metal electrode patterns form pairs of two groups and may also be alternately disposed, and may also meet with each other at the center while being alternately disposed at both left and right ends based on the x direction.

Referring back to FIG. 6, the metal electrode patterns 130-1 corresponding to the grouped transparent electrode patterns 120 may be commonly connected to the touch sensing circuit as a group, and touch lines 132-1 connecting the grouped metal electrode patterns 130-1 and the touch sensing circuit are disposed at an opposite side to the display lines 122 of the grouped transparent electrode patterns 120 corresponding at the opposite side, and the display lines 122 are connected to one side and the touch lines 132-1 may be connected to the other side.

Figure 7:
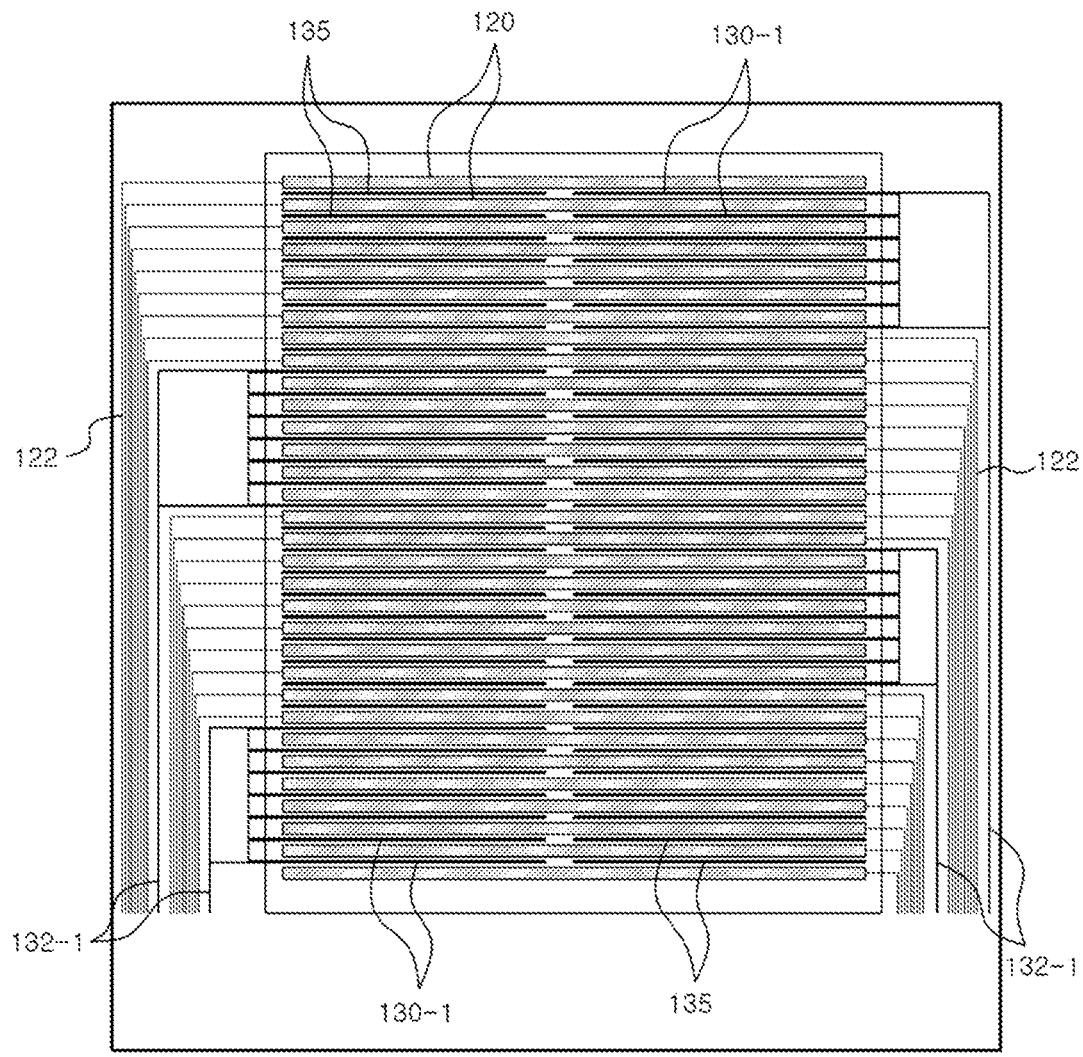

Referring to FIG. 7, in order to uniformly express brightness or definition between an area formed with the grouped metal electrode patterns and an area without the grouped metal electrode patterns, metal dummy patterns 135 may be further formed. The metal dummy patterns 135 may be located on the same line as the metal electrode patterns 130-1 in the y direction, respectively, and may be formed in the area without the metal electrode patterns 130-1.

Figure 8:
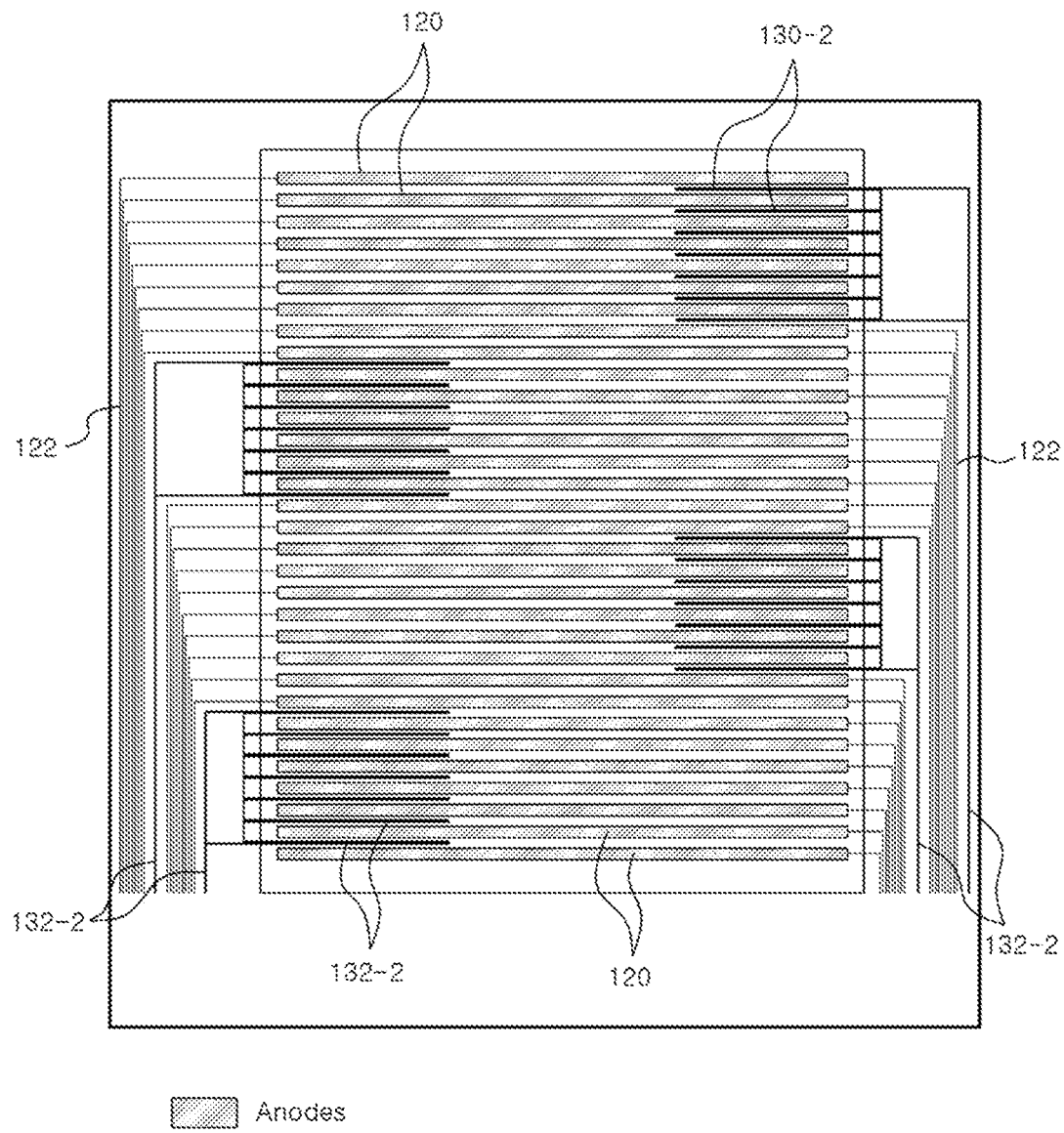

Referring to FIG. 8, the metal electrode patterns 130-2 may be less than ⅓ of the transparent electrode patterns 120 in length. Depending on the signal levels from the grouped metal electrode patterns 130-2, one can distinguish where the finger touch is located on x direction: on left side metal electrodes, on right side metal electrodes, or in between of the left and right metal electrodes. According to the intensity of the signal sensed from each grouped metal electrode pattern 130-2, it may be determined whether the finger contact is located on the metal electrode patterns 130-2 in the y direction, located therebetween even at an upper end or a lower end, or located at the center without the metal electrode patterns 130-2.

Figure 9:
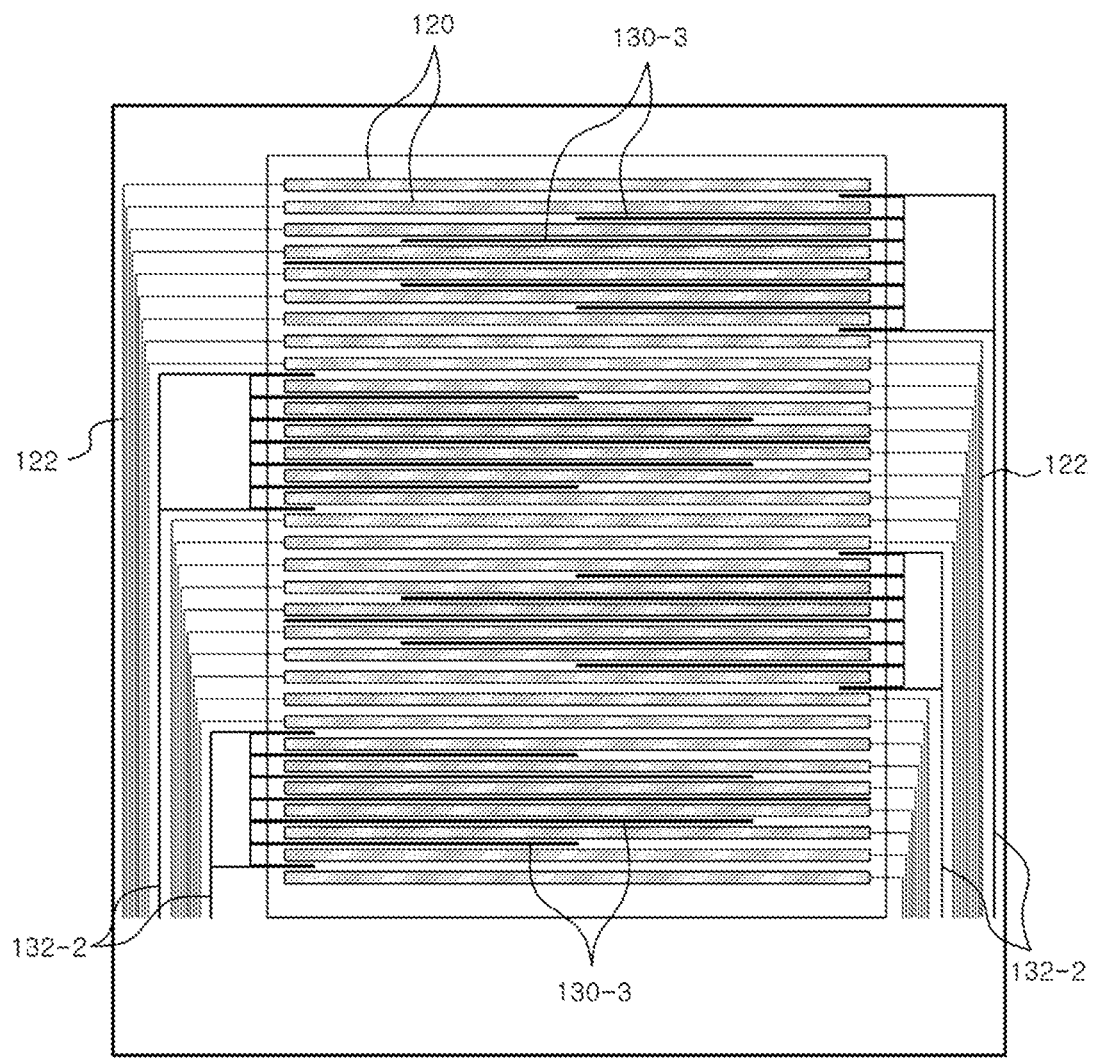

Referring to FIG. 9, grouped metal electrode patterns 130-3 may be disposed in a triangular shape. For example, the metal electrode patterns 130-3 may be formed to have a length stepping up and then down in the same group in the x direction and may be entirely formed in an isosceles triangular shape. In addition, the metal electrode patterns 130-3 can be arranged in various shapes such as a right-angled triangle.

Figure 10:
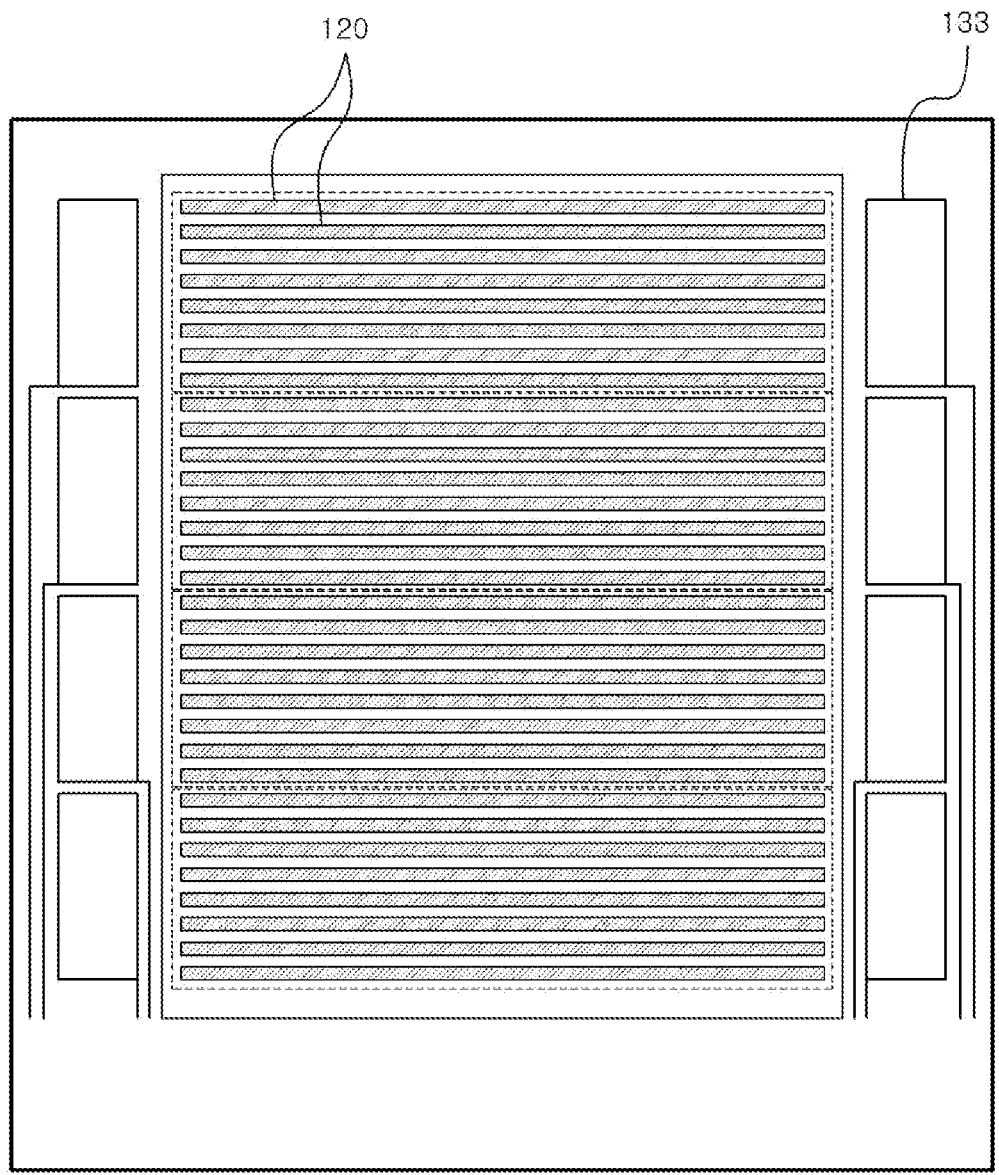
FIG. 10 is a diagram for describing an arrangement of transparent electrode patterns and metal electrode patterns in a PMOLED display according to yet another exemplary embodiment of the present invention.

FIG. 10 is a diagram for describing an arrangement of transparent electrode patterns and metal electrode patterns in a PMOLED display according to yet another exemplary embodiment of the present invention.

Referring to FIG. 10, metal electrode patterns 133 may be provided to be adjacent to both ends of the transparent electrode patterns 120 in the y direction. The metal electrode patterns 133 may sense a voltage change or a capacitance change by a finger at both sides of the transparent electrode patterns 120 and may be used for determining whether a touched point is adjacent to the upper portion or the lower portion in the y-axis.

In addition, the metal electrode patterns may be provided at only one side of both ends of the transparent electrode patterns in the y direction and may be alternately supplied up and down.

Further, like the exemplary embodiment, one metal electrode pattern 133 may also be formed over a wide area so as to correspond to the plurality of transparent electrode patterns 120.

As described above, although the present invention has been described with reference to the preferred exemplary embodiments, those skilled in the art will appreciate that various changes and modifications are possible, without departing from the scope and spirit of the present invention as disclosed in the appended claims.

The invention claimed is:

1. A PMOLED display, which includes a plurality of lower electrode patterns arranged in parallel in the direction of an x-axis, a plurality of transparent electrode patterns arranged in parallel in the direction of a y-axis and being perpendicular to the lower electrode patterns, and an organic compound layer interposed between the lower electrode patterns and the transparent electrode patterns, to perform a display output and a touch sensing by time-sharing a control period for the lower electrode patterns and the transparent electrode patterns into a display control period and a touch-sensor control period in every display frame time, the PMOLED display comprising:
a driving node which is formed on a line for communication between the transparent electrode patterns and a display driving circuit;
a touch sensing unit connecting the driving node and a touch sensing circuit; and
a plurality of metal electrode patterns provided between the transparent electrode patterns to have a length shorter than the transparent electrode patterns,
wherein the display output is performed by connecting the transparent electrode patterns and the display driving circuit in the display control period, the touch sensing is performed by connecting the transparent electrode patterns and the touch sensing circuit by the touch sensing unit in the touch-sensor control period,
the transparent electrode patterns sense a location in the x direction with respect to a finger contact, and the metal electrode patterns sense a location in the y direction with respect to the finger contact.

2. The PMOLED display of claim 1, wherein a plurality of adjacent driving nodes is connected with the touch sensing unit and during the touch sensing, transparent electrode patterns commonly connected to the touch sensing unit as a group are used as a single touch sensor,
display lines connecting the grouped transparent electrode patterns and the display driving circuit are distributed vertically based on the transparent electrode patterns in order of the grouped transparent electrode patterns,
metal electrode patterns corresponding to the grouped transparent electrode patterns are commonly connected to the touch sensing circuit as a group, and touch lines for connecting the grouped metal electrode patterns and the touch sensing circuit are disposed at an opposite side to display lines of the corresponding grouped transparent electrode patterns.

3. The PMOLED display of claim 2, further comprising:
   metal dummy patterns located in line with the metal electrode patterns in the y direction and formed in an area without the metal electrode patterns.

4. The PMOLED display of claim 2, wherein the metal electrode patterns are less than ⅓ of the transparent electrode patterns in length.

5. The PMOLED display of claim 2, wherein the metal electrode patterns are formed to have lengths stepping up, stepping down or stepping up then down in the same group in the x direction.

6. The PMOLED display of claim 1, wherein during the touch sensing, a pulse type driving voltage is supplied to the transparent electrode patterns and the lower electrode patterns or one of the transparent electrode patterns and the lower electrode patterns is floated.

7. The PMOLED display of claim 1, wherein a touch reference voltage is supplied to the lower electrode patterns before the touch-sensor control period, a display reference voltage is supplied to the lower electrode patterns before the display control period, and the display reference voltage is set to be higher than the touch reference voltage.

8. The PMOLED display of claim 7, wherein the touch reference voltage is set in a range of −3 V or more and 3 V or less and the display reference voltage is set in a range of 5 V or more and 20 V or less.

9. A PMOLED display, which includes a plurality of lower electrode patterns arranged in parallel in the direction of an x-axis, a plurality of transparent electrode patterns arranged in parallel in the direction of a y-axis and being perpendicular to the lower electrode patterns, and an organic compound layer interposed between the lower electrode patterns and the transparent electrode patterns, to perform a display output and a touch sensing by time-sharing a control period for the lower electrode patterns and the transparent electrode patterns into a display control period and a touch-sensor control period in every display frame time, the PMOLED display comprising:
   a driving node which is formed on a line for communication between the transparent electrode patterns and a display driving circuit;
   a touch sensing unit connecting the driving node and a touch sensing circuit; and
   a plurality of metal electrode patterns provided to be adjacent to the transparent electrode patterns,
   wherein the display output is performed by connecting the transparent electrode patterns and the display driving circuit in the display control period and the touch sensing is performed by connecting the transparent electrode patterns and the touch sensing circuit by the touch sensing unit in the touch-sensor control period,
   the transparent electrode patterns sense a location in the x direction with respect to a finger contact and the metal electrode patterns sense a location in the y direction with respect to the finger contact.

10. The PMOLED display of claim 9, wherein the metal electrode patterns are provided on at least one side of both ends of the transparent electrode patterns in the y direction.

* * * * *